United States Patent
Kool et al.

(10) Patent No.: US 11,846,026 B2
(45) Date of Patent: Dec. 19, 2023

(54) COATED ARTICLE FOR HOT HYDROCARBON FLUID AND METHOD OF PREVENTING FUEL THERMAL DEGRADATION DEPOSITS

(71) Applicant: General Electric Company, Schenectady, NY (US)

(72) Inventors: Lawrence Bernard Kool, Clifton Park, NY (US); Bangalore Aswatha Nagaraj, West Chester, OH (US); Thomas George Holland, Cincinnati, OH (US); Alfred Albert Mancini, Cincinnati, OH (US); Michael Anthony Benjamin, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 190 days.

(21) Appl. No.: 17/150,613

(22) Filed: Jan. 15, 2021

(65) Prior Publication Data

US 2022/0228247 A1 Jul. 21, 2022

(51) Int. Cl.
*F02C 7/30* (2006.01)
*B32B 15/04* (2006.01)
(Continued)

(52) U.S. Cl.
CPC .................. *C23C 2/04* (2013.01); *B05D 1/12* (2013.01); *B05D 1/18* (2013.01); *B05D 5/00* (2013.01);
(Continued)

(58) Field of Classification Search
CPC ......... C23C 24/00; C23C 20/00; C23C 20/06; C23C 20/08; C23C 14/087; C23C 4/04; C23C 4/06; C23C 4/10; C23C 4/18; C23C 2/04; C23C 2/26; C23C 26/00; F02C 7/30; F01D 5/28; F01D 5/288; F01D 5/286; F05D 2220/323; F05D 2230/90; F05D 2230/30; F05D 2230/31; Y02T 50/60; B05D 1/12; B05D 1/18; B05D 5/00; B32B 15/04;
(Continued)

(56) References Cited

U.S. PATENT DOCUMENTS 3,558,349 A 1/1971 Kneppel et al.
3,649,343 A 3/1972 Reed et al.
(Continued)

FOREIGN PATENT DOCUMENTS

DE 2939280 A1 4/1981
GB 190110705 A 11/1901
WO WO2015034768 A1 3/2015

*Primary Examiner* — Michael E. La Villa
(74) *Attorney, Agent, or Firm* — Dority & Manning, P.A.

(57) ABSTRACT

A hydrocarbon fluid containment article having a wall with a surface that is wetted by hydrocarbon fluid. The surface includes an anti-coking coating. The anti-coking coating includes a copper salt, a silver salt, or a combination thereof. A gas turbine engine component including a wall having a first surface and an anti-coking coating on the first surface of the wall that is wetted by hydrocarbon fluid. The anti-coking coating including a copper salt, a silver salt, or a combination thereof that prevents the formation of gum or coke on a surface thereon. Methods for reducing the deposition of thermal decomposition products on a wall of an article are also provided.

18 Claims, 1 Drawing Sheet

(51) Int. Cl.

| | |
|---|---|
| C23C 2/04 | (2006.01) |
| C23C 20/00 | (2006.01) |
| C23C 24/00 | (2006.01) |
| C23C 20/08 | (2006.01) |
| C23C 2/26 | (2006.01) |
| F01D 5/28 | (2006.01) |
| B05D 5/00 | (2006.01) |
| B32B 15/18 | (2006.01) |
| C23C 4/10 | (2016.01) |
| C23C 20/06 | (2006.01) |
| B05D 1/18 | (2006.01) |
| B05D 1/12 | (2006.01) |
| C23C 4/06 | (2016.01) |
| C23C 14/08 | (2006.01) |
| C23C 4/18 | (2006.01) |
| C23C 4/04 | (2006.01) |
| C23C 26/00 | (2006.01) |
| C09D 1/00 | (2006.01) |

(52) U.S. Cl.
CPC ............ *B32B 15/04* (2013.01); *B32B 15/043* (2013.01); *B32B 15/18* (2013.01); *C09D 1/00* (2013.01); *C23C 2/26* (2013.01); *C23C 4/04* (2013.01); *C23C 4/06* (2013.01); *C23C 4/10* (2013.01); *C23C 4/18* (2013.01); *C23C 14/087* (2013.01); *C23C 20/00* (2013.01); *C23C 20/06* (2013.01); *C23C 20/08* (2013.01); *C23C 24/00* (2013.01); *C23C 26/00* (2013.01); *F01D 5/28* (2013.01); *F01D 5/286* (2013.01); *F01D 5/288* (2013.01); *F02C 7/30* (2013.01); *F05D 2220/323* (2013.01); *F05D 2230/30* (2013.01); *F05D 2230/31* (2013.01); *F05D 2230/90* (2013.01); *Y02T 50/60* (2013.01); *Y10T 428/12847* (2015.01); *Y10T 428/12944* (2015.01); *Y10T 428/12951* (2015.01); *Y10T 428/12979* (2015.01); *Y10T 428/2495* (2015.01); *Y10T 428/24967* (2015.01); *Y10T 428/26* (2015.01); *Y10T 428/265* (2015.01)

(58) Field of Classification Search
CPC .................. B32B 15/043; B32B 15/18; Y10T 428/12944; Y10T 428/12951; Y10T 428/12979; Y10T 428/12847; Y10T 428/2495; Y10T 428/24967; Y10T 428/26; Y10T 428/265; C09D 1/00
See application file for complete search history.

(56) References Cited

U.S. PATENT DOCUMENTS

| | | |
|---|---|---|
| 3,929,118 A | 12/1975 | Leong |
| 5,240,741 A | 8/1993 | Edwards, III et al. |
| 5,266,360 A * | 11/1993 | Edwards, III ......... F01D 25/007 427/435 |
| 5,891,584 A | 4/1999 | Coffinberry |
| 6,156,439 A | 12/2000 | Coffinberry |
| 8,777,130 B2 | 7/2014 | Tamol |
| 2017/0051675 A1 * | 2/2017 | Mcmasters ............. C23C 16/18 |

* cited by examiner

COATED ARTICLE FOR HOT HYDROCARBON FLUID AND METHOD OF PREVENTING FUEL THERMAL DEGRADATION DEPOSITS

FIELD

The present disclosure generally relates to an article and a turbine engine component having an anti-coking coating thereon. The present disclosure also relates to methods for preventing or reducing the deposition of thermal decomposition products on surfaces in contact with a hydrocarbon fluid.

BACKGROUND

Coke deposition is a common issue in aircraft fuel and lubrication systems exposed to high temperatures. Coke deposition can be caused by the catalytic-thermal degradation of hydrocarbon fluids, resulting in carbon becoming attached and building up as deposits on surfaces contacted by a fuel or oil. Carbon deposits may develop if the fluid circuit is operated at reduced flow rates or closed without the remaining stagnant fuel being purged. As the deposits collect, they can become sufficiently large to reduce or even obstruct fluid flow. In the case of a fuel circuit, such carbon deposition can lead to degraded engine performance, reduced heat transfer efficiencies, increased pressure drops, and increased rates of material corrosion and erosion, all of which can necessitate the use of expensive de-coking procedures.

Accordingly, improvements for preventing the formation and deposition of gum and coke deposits would be desirable.

BRIEF DESCRIPTION

Aspects and advantages of the invention will be set forth in part in the following description, or may be obvious from the description or may be learned through practice of the invention.

In one aspect, embodiments of the present disclosure relate to a hydrocarbon fluid containment article through which a hydrocarbon fluid flows. The hydrocarbon fluid containment article includes a wall having a first surface and an anti-coking coating on the first surface of the wall that is wetted by the hydrocarbon fluid. The anti-coking coating includes a copper salt, a silver salt, or a combination thereof. The anti-coking coating prevents the formation of gum or coke on a surface thereon.

In one aspect, embodiments of the present disclosure are directed to a gas turbine engine component including a wall having a first surface and an anti-coking coating on the first surface of the wall that is wetted by the hydrocarbon fluid. The anti-coking coating including a copper salt, a silver salt, or a combination thereof, the hydrocarbon fluid contacting and flowing across the anti-coking coating, the anti-coking coating preventing the formation of gum or coke thereon.

In another aspect, embodiments of the present disclosure relate to a method for reducing deposition of thermal decomposition products on a wall of an article containing a hydrocarbon fluid at temperatures above 105° C. The method includes depositing an anti-coking coating on a first surface of the wall of the article that is wetted by the hydrocarbon fuel. The anti-coking coating includes a copper salt, a silver salt, or a combination thereof, the hydrocarbon fluid contacting and flowing across the anti-coking coating, the anti-coking coating preventing the formation of gum or coke thereon.

These and other features, aspects and advantages of the present invention will become better understood with reference to the following description and appended claims. The accompany drawings, which are incorporated in and constitute a part of this specification, illustrate embodiments of the invention and, together with this description, serve to explain the principles of the invention.

BRIEF DESCRIPTION OF THE DRAWINGS

The above and other aspects, features, and advantages of the present disclosure will become more apparent in light of the subsequent detailed description when taken in conjunction with the accompanying drawings in which.

DETAILED DESCRIPTION

Figure 1:
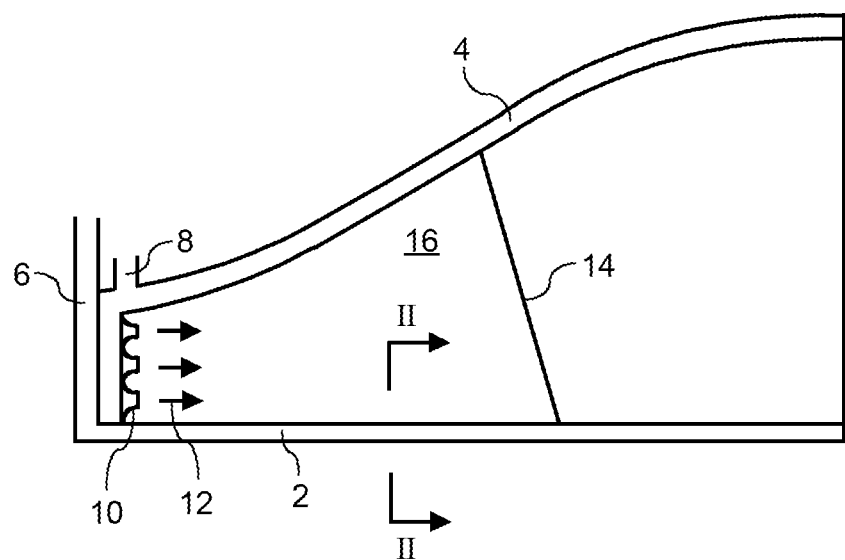
FIG. 1 is a partial longitudinal view of a high pressure turbine nozzle for a jet engine fueled by distillate fuel incorporating the anti-coking coating disclosed herein.

One or more embodiments of the present disclosure will be described below. Unless defined otherwise, technical and scientific terms used herein have the same meaning as is commonly understood by one of ordinary skill in the art to which this disclosure belongs.

The terms "a" and "an" do not denote a limitation of quantity, but rather denote the presence of at least one of the referenced items. Approximating language, as used herein throughout the specification and claims, may be applied to modify any quantitative representation that could permissibly vary without resulting in a change in the basic function to which it is related. Accordingly, a value modified by a term or terms, such as "about", are not to be limited to the precise value specified. Additionally, when using an expression of "about a first value—a second value," the about is intended to modify both values. In at least some instances, the approximating language may correspond to the precision of an instrument for measuring the value.

Here, and throughout the specification and claims, range limitations may be combined and/or interchanged, such ranges are identified and include all the sub-ranges contained therein unless context or language indicates otherwise. Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

The anti-coking coating and methods of the present disclosure can include, consist essentially of, or consist of, the components of the present disclosure as well as other materials described herein. As used herein, "consisting essentially of" means that the composition or component may include additional materials, but only if the additional materials to not materially alter the basic and novel characteristics of the claimed composition or methods.

The terms hydrocarbon fluid, hydrocarbon fuel and distillate fuel may be used interchangeably herein.

Generally, the present subject matter provides an article, such as hydrocarbon fluid containment article through which a hydrocarbon fluid flows. Surfaces of the article wetted by the hydrocarbon fluid include an anti-coking coating. The anti-coking coating includes a copper salt, a silver salt, or a combination thereof. The anti-coking coating prevents the formation of gum or coke thereon. Gas turbine engine components including the anti-coking coating and methods for reducing deposition of thermal decomposition products on the wall of an article are also provided.

The disclosure has applicability to any hydrocarbon fluid or fuel in which gum, coke and/or sulfur compounds form when the fluid is exposed to heat. Indeed, thermal instability or fuel instability refers to the formation of undesired deposits that occurs when hydrocarbon fluids are exposed to high temperatures, generally those above about 140° C. Two distinct mechanisms contribute to the formation of carbonaceous substances. The first mechanism, referred to as the coking process, produces a consistent increase in the rate of coke formation and coke deposits at temperatures of about 650° F. (about 345° C.) or greater. Coke formation results from high levels of hydrocarbon pyrolysis, and eventually limits the usefulness of the fuel. The second mechanism primarily occurs at lower temperatures, generally in the range of about 220° F. to about 650° F. (about 105° C. to about 345° C.) and involves oxidation reactions that lead to polymerization and carbonaceous gum deposits. Both coke and gum formation can occur simultaneously in the mid-temperature region. Given operating temperatures of certain engines, such as gas turbine engines, gum and coke deposits can form on hydrocarbon wetted surfaces. Accordingly, the anti-coking coating disclosed herein prevents the formation of gum and certain coke substances in hydrocarbon fuels and further prevents the adherence of gum and certain coke substances on surfaces exposed to hydrocarbon fuels.

A fluid containment article is shown in FIG. 1 which represents a heat exchanger for cooling the high pressure turbine nozzle of a jet engine by transferring the heat generated therein to liquid hydrocarbon fuel confined in and transported through conduits or chambers adjacent the nozzle wall.

In FIG. 1, liquid hydrocarbon fuel enters the high pressure turbine nozzle at conduit 6 and passes through passageway 2 where heat from combustion chamber 16 is cooled by the liquid hydrocarbon fuel passing through passageway 2. Heat exchange occurs between the walls of combustion chamber 16 and the liquid hydrocarbon fuel passing through passageway 2. In certain instances, the walls of the nozzle which form combustion chamber 16 have an operating temperature of up to about 1200° F. (about 649° C.). Similarly, hydrocarbon fuel also enters passageway 4 at conduit 8 and passes through passageway 4 where heat exchange also occurs between the wall of combustion chamber 16 and the hydrocarbon fuel in passageway 4. Heated and vaporized hydrocarbon fuel 12 flows into combustion chamber 16 through gas injection ports 10.

Figure 2:
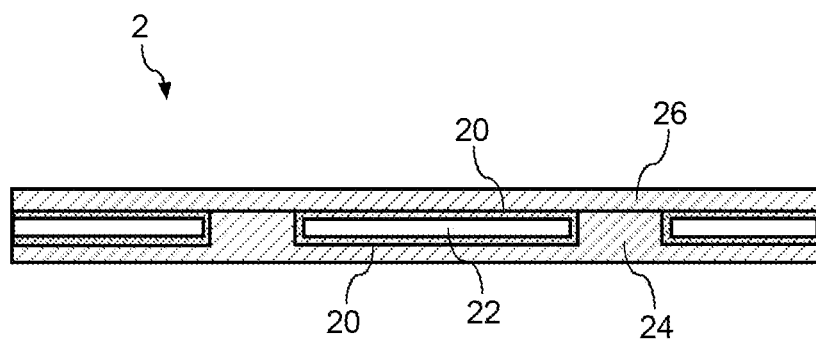
FIG. 2 is a section view taken along lines of II-II of FIG. 1 showing fuel containment passages for circulating distillate fuel.

FIG. 2 illustrates the fuel containment passageway 2 of FIG. 1 being taken along the lines II-II of FIG. 1. As shown, passageway 2 contains walls 24 and 26 in which fuel passageway 22 is formed. The anti-coking coating 20 of the present disclosure is coated on substrate material forming walls 24 and 26 so that it forms an anti-coking coating 20 over the substrate surfaces of passageway 22. Substrate materials for walls 24 and 26 may be stainless steel, corrosion-resistant alloys of nickel and chromium, high-strength, corrosion-resistant nickel-base alloys, cobalt-base alloys, and the like. These substrate materials cause or promote the formation of fuel thermal degradation products, such as gum, coke and/or sulfur compounds or mixtures thereof, in hydrocarbon fluids and fuels. Hydrocarbon fuel is transported through passageway 22 and contacts the anti-coking coating 20 disposed on walls 24 and 26.

In embodiments, the anti-coking coating 20 is catalytically active and catalyzes the fuel to promote the formation of a loosely-adherent or non-adherent coke in the hydrocarbon fluid. For instance, the anti-coking coating 20 promotes the formation of coke substances that do not adhere to or undergo additional polymerization along passageway 22. The anti-coking coating 20 is sufficient to prevent the formation of deposits resulting from sulfur, oxygen, and mixtures thereof in hydrocarbon fuel with metal atoms along the surfaces of passageway 22. Thus, the anti-coking coating 20 promotes the formation of certain coke products while simultaneously inhibiting the formation of gum products, which prevent, reduce or inhibit the deposition of gum along passageway 22. The loosely-adherent or non-adherent coke products remain suspended or dispersed in the fuel where it is then transported with the fuel to the combustor for burning.

In addition to its catalytic activity, the anti-coking coating 20 may also provide a physical diffusion barrier between the substrate material of walls 24 and 26 and the hydrocarbon fuel. More specifically, the anti-coking coating 20 can also provide a physical diffusion barrier preventing certain metal atoms from migrating from the walls 24 and 26 into the hydrocarbon fuel.

The anti-coking coating 20 can include one or more coating materials such as metal salts. Such metal salts can include one or more copper salts, one or more aluminum salts, or combinations thereof. For example, the anti-coking coating 20 can include copper (II) sulfate, copper (II) nitrate, copper (II) chloride, copper (II) chloride anhydrous, copper (II) chloride dihydrate, or combinations thereof. In embodiments, the anti-coking coating 20 can include one or more silver salts such as silver chloride, silver fluoride, silver nitrate, silver sulfate, and combinations thereof.

The anti-coking coating 20 as applied can have a coating thickness ranging from about 0.5 µm to about 10 µm, such as from about 1 µm to about 9 µm, such as from about 2 µm to about 8 µm, such as from about 3 µm to about 7 µm, such as from about 4 µm to about 6 µm.

Although the disclosure is not directed to or limited by any particular hydrocarbon fluid or hydrocarbon fuel, typical fuels for which the method and fluid containment and other articles of the present disclosure are adapted, and typical fuels from which the substrates of fluid containment articles are protected in accordance with the present disclosure, are the combustible hydrocarbon gases, such as natural gas, and the hydrocarbon or distillate fuels generally discussed above and include hydrocarbons and distillation products thereof which are generally liquid at room temperature. The fluids may be mixtures of hydrocarbons, mixtures of such distillation products, mixtures of hydrocarbons and distillation products, gasoline, No. 1 or No. 2 diesel fuels, jet engine fuels, such as Jet-A fuel, or the foregoing fuels mixed with additives which are well-known in the art. Hydrocarbon fuels refer to the liquid fuels which are conventionally used in reaction motors, including but not limited to, industrial gas turbines, engines used in internal combustion engines, including but not limited to automobile and truck engines, jet propelled aircraft or any other gas turbine engine, all of which are conventionally known in the art.

The articles of the present disclosure may be any component that is adapted to contact or contain hot hydrocarbon fluid, for example, liquid hydrocarbon jet engine or diesel fuel, heated to a temperature at which degradation products form in hydrocarbons, hydrocarbons circulating in conduits, heat exchangers and the like, of refineries, polymer plants and power plants, furnaces and the like. Such articles for containing hot hydrocarbon fluid are defined herein as fluid containment articles. Examples of such fluid containment articles are discussed above and include any device in which hot hydrocarbon fluid can be confined, stored, transported or otherwise subjected to heat exchange without ignition or combustion of the hot fluid. The present disclosure is particularly adaptable to heat transfer surfaces where heat is transferred from a combustor or other heat source through a wall to liquid hydrocarbon fluid. Specific examples of articles for containing or contacting hot hydrocarbon fluids in accordance with the present disclosure include fuel storage tanks, conduits for transporting liquid fuel, coils and other devices for heat exchange contact with fuel, fuel injector surfaces, nozzles and the like.

Other articles which may be coated with the anti-coking coating 20 of the present disclosure, include automobile and truck engine parts which are exposed to hot hydrocarbon fuel, e.g., gasoline, natural gas, diesel fuel and the like, including parts of engines in which air and fuel are mixed and/or atomized and/or vaporized. These parts include valves, cylinders, fuel injectors, fuel atomizers, combustion chambers and the like.

The anti-coking coating 20 can be applied to the desired substrate via any suitable process. Suitable coating processes include, but are not limited to dipping, soaking, spraying, painting, flowing, or using any other process suitable to apply the anti-coking coating to the article.

In certain embodiments, the anti-coking coating can be applied via submerging the article in solution containing one or more metal salts. For example, the article formed of a metal substrate having one or more hydrocarbon fuel wetting surfaces thereon, such as a fuel nozzle can be fabricated and assemble. The assembled article can then be exposed to a solution containing one or metal salts. The solution can also include one or more solvents, such as one or more polar organic solvents. Non-limiting examples of polar organic solvents suitable for use include elastomers, such as esters, ketones, ethers, alcohols, or combinations thereof. A solvent recirculation system can be utilized to facilitate coating of the article. A salt control system capable of maintaining the concentration of the metal salt in solution can also be utilized. For example, the metal salt in solution can be maintained at saturation or at any other desired level during the coating process. Dipping and/or soaking the article in such a manner allows for the metal salt to be applied to metal surfaces throughout the article. The article can be exposed to the solution containing one or more metal salts until the desired level or thickness of coating on the article is achieved. The coated article can then be removed from the recirculation system, purged with any suitable inert gas, and dried to remove any remaining solvent.

Advantageously, utilizing a dipping or soaking method to apply the anti-coking coating allows for an even application of the coating on hard-to-reach or rough surfaces of the article. Certain hydrocarbon fluid containment articles can include internal surfaces having small orifices, bent projections, rough surfaces, etc., that can make coating the article via line-of-sight application processes very difficult if not nearly impossible. The disclosed soaking method, however, includes circulating solution containing the anti-coking coating material such that the solution flows in and across the surfaces of the article allowing for the fluid to penetrate and coat rough or hard-to-reach surfaces. Furthermore, no sub-coatings, pre-treatment coatings, or surface preparation of the article is necessary prior to applying the anti-coking coating disclosed herein, which simplifies manufacturing of the article and can reduce manufacturing costs and waste. For example, the application surface of the article does not need to be polished to a certain smoothness nor do native oxide residues or layers on the article need to be removed prior to applying the anti-coking coating disclosed herein.

During coating it is contemplated that other surfaces of the article, such as external surfaces may be coated with the anti-coking coating due to overspray or immersion of the entire article in the recirculation system. Typically, such additional coating of the article is allowed and will not affect the article during operation. However, portions of the anti-coking coating can be removed from undesired surfaces of the article via any suitable mechanical or chemical removal process, such as grit blasting. Additionally, certain external surfaces can be masked prior to subjecting the article to the coating process, such that the masked surfaces are not coated by the anti-coking coating.

Given certain materials in the anti-coking coating (e.g., copper salts), the anti-coking coating material may be applied to the article in an isolated environment. For instance, the anti-coking coating can be deposited on the wall of the article in a separate facility from where the remaining fuel system is assembled and manufactured. Such facility isolation or separation may be desired so that the anti-coking coating materials disclosed herein do not contaminate the rest of the facility in which remaining parts of the entire fuel assembly are assembled. Further, it is contemplated that the anti-coking coating material can be applied to the article in the same manufacturing facility, as long as the coating process is completed in an isolated manner such that anti-coking coating materials do not contaminate the manufacturing facility.

Example embodiments, also provide a method for reducing deposition of thermal decomposition products on a wall of an article containing a hydrocarbon fluid at temperatures above 300° C. The method comprising the step of depositing a coating on the wall of the article, the coating comprising an anti-coking coating protecting the wall from chemical attack by constituents in the hydrocarbon fluid. The anti-coking coating includes one or more metal salts, such as copper (II) chloride, copper (II) chloride anhydrous, copper (II) chloride dihydrate, or combinations thereof. The anti-coking coating catalyzes the hydrocarbon fluid to form particulates of carbonaceous gum substances or coke suspended within the hydrocarbon fluid that are non-adherent or loosely-adherent to the anti-coking coating such that the formation or adhesion of gum on the wall of the article is prevented.

Although the present disclosure has utility in any fuel containment article or in any fuel containment system in which fuel does not undergo combustion, and it is particularly useful in forming a catalytic coating in fuel containment articles and fuel containment systems wherein the fuel is used as a heat exchange medium to remove heat from various systems in gas turbines, both industrial and those used in aircraft and the like, it is particularly useful in the heat exchanger surfaces in fuel systems of a gas turbine, a scramjet engine, a ramjet engine, or a turbojet engine or as a conduit for transporting heated hydrocarbon fuel in a fuel system of any of the foregoing.

Further aspects of the invention are provided by the subject matter of the following clauses:

1. A hydrocarbon fluid containment article through which a hydrocarbon fluid flows, the hydrocarbon fluid containment article comprising: a wall having a first surface and an anti-coking coating on the first surface of the wall that is wetted by the hydrocarbon fluid, the anti-coking coating comprising a copper salt, a silver salt, or a combination thereof, the hydrocarbon fluid contacting and flowing across the anti-coking coating, the anti-coking coating preventing the formation of gum or coke thereon.

2. The article of any preceding clause wherein the copper salt or silver salt of the anti-coking coating catalyzes the hydrocarbon fluid to form particulates of carbonaceous gum or coke suspended within the hydrocarbon fluid that are non-adherent or loosely-adherent to the anti-coking coating.

3. The article of any preceding clause wherein the copper salt comprises copper (II) sulfate, copper (II) nitrate, copper (II) chloride, copper (II) chloride anhydrous, copper (II) chloride dihydrate, or combinations thereof.

4. The article of any preceding clause wherein the silver salt comprises silver chloride, silver fluoride, silver nitrate, silver sulfate, or combinations thereof.

5. The article of any preceding clause wherein the wall comprises a metal surface.

6. The article of any preceding clause wherein the anti-coking coating has a thickness of from about 0.5 μm to about 10 μm.

7. The article of any preceding clause wherein the anti-coking coating is deposited on the wall by dipping or soaking the article in a liquid containing a copper salt, silver salt, or combinations thereof to coat the first surface of the wall throughout the article.

8. The article of any preceding clause wherein the hydrocarbon fluid is at a temperature of about 105° C. to about 345° C.

9. The article of any preceding clause wherein the article is a gas turbine engine component.

10. The article of any preceding clause wherein the gas turbine engine component comprises fuel/air heat exchangers, pipes, fuel nozzles, oil sumps, or combinations thereof.

11. A gas turbine engine component comprising: a wall having a first surface and an anti-coking coating on the first surface of the wall that is wetted by the hydrocarbon fluid, the anti-coking coating comprising a copper salt, a silver salt, or a combination thereof, the hydrocarbon fluid contacting and flowing across the anti-coking coating, the anti-coking coating preventing the formation of gum or coke thereon.

12. The component of any preceding clause wherein the copper salt or silver salt of the anti-coking coating catalyzes the hydrocarbon fluid to form particulates of carbonaceous gum substances or coke suspended within the hydrocarbon fluid that are non-adherent or loosely-adherent to the anti-coking coating.

13. The component of any preceding clause wherein the copper salt comprises copper (II) sulfate, copper (II) nitrate, copper (II) chloride, copper (II) chloride anhydrous, copper (II) chloride dihydrate, or combinations thereof.

14. The component of any preceding clause wherein the silver salt comprises silver chloride, silver fluoride, silver nitrate, silver sulfate, and combinations thereof.

15. The component of any preceding clause wherein the first surface of the wall comprises a metal surface such as an iron-, nickel-, or chromium-containing metal surface.

16. The component of any preceding clause wherein the anti-coking coating has a thickness of from about 0.5 μm to about 10 μm.

17. The component of any preceding clause wherein the hydrocarbon fluid is at a temperature of about 150° C. to about 450° C.

18. The component of any preceding clause wherein the component comprises fuel/air heat exchangers, pipes, fuel nozzles, oil sumps, and combinations thereof.

19. A method for reducing deposition of thermal decomposition products on a wall of an article containing a hydrocarbon fluid at temperatures above 105° C. comprising, depositing an anti-coking coating on a first surface of the wall of the article that is wetted by the hydrocarbon fuel, the anti-coking coating comprising a copper salt, a silver salt, or a combination thereof, the hydrocarbon fluid contacting and flowing across the anti-coking coating, the anti-coking coating preventing the formation of gum or coke thereon.

20. The method of any preceding clause wherein deposition the anti-coking coating on the first surface of the wall of the article is performed in an isolated environment.

This written description uses examples to describe the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A hydrocarbon fluid containment article through which a hydrocarbon fluid flows, the hydrocarbon fluid containment article comprising:
   a wall having a first surface and an anti-coking coating on the first surface of the wall that is wetted by the hydrocarbon fluid, the anti-coking coating comprising a copper salt, a silver salt, or a combination thereof, the hydrocarbon fluid contacting and flowing across the anti-coking coating, wherein the copper salt comprises copper (II) sulfate, copper (II) nitrate, copper (II) chloride, copper (II) chloride anhydrous, copper (II) chloride dihydrate, or combinations thereof.

2. The article of claim 1, wherein the copper salt or silver salt of the anti-coking coating catalyzes the hydrocarbon fluid to form particulates of carbonaceous gum or coke suspended within the hydrocarbon fluid that are non-adherent or loosely-adherent to the anti-coking coating.

3. The article of claim 1, wherein the silver salt comprises silver chloride, silver fluoride, silver nitrate, silver sulfate, or combinations thereof.

4. The article of claim 1, wherein the wall comprises a metal surface.

5. The article of claim 1, wherein the anti-coking coating has a thickness of from about 0.5 μm to about 10 μm.

6. The article of claim 1, wherein the anti-coking coating is deposited on the wall by dipping or soaking the article in a liquid containing the copper salt, the silver salt, or combinations thereof to coat the first surface of the wall throughout the article.

7. The article of claim 1, wherein the hydrocarbon fluid is at a temperature of about 105° C. to about 345° C.

8. The article of claim 1, wherein the article is a gas turbine engine component.

9. The article of claim 1, wherein the anti-coking coating preventing the formation of gum or coke thereon.

10. A gas turbine engine component comprising:
a wall having a first surface and an anti-coking coating on the first surface of the wall that is wetted by the hydrocarbon fluid, the anti-coking coating comprising a copper salt, a silver salt, or a combination thereof, the hydrocarbon fluid contacting and flowing across the anti-coking coating, wherein the copper salt comprises copper (II) sulfate, copper (II) nitrate, copper (II) chloride, copper (II) chloride anhydrous, copper (II) chloride dihydrate, or combinations thereof.

11. The component of claim 10, wherein the copper salt or silver salt of the anti-coking coating catalyzes the hydrocarbon fluid to form particulates of carbonaceous gum substances or coke suspended within the hydrocarbon fluid that are non-adherent or loosely-adherent to the anti-coking coating.

12. The component of claim 10, wherein the silver salt comprises silver chloride, silver fluoride, silver nitrate, silver sulfate, and combinations thereof.

13. The component of claim 10, wherein the first surface of the wall comprises a metal surface such as an iron-, nickel-, or chromium-containing metal surface.

14. The component of claim 10, wherein the anti-coking coating has a thickness of from about 0.5 µm to about 10 µm.

15. The component of claim 10, wherein the hydrocarbon fluid is at a temperature of about 150° C. to about 450° C.

16. The component of claim 10, wherein the component comprises fuel/air heat exchangers, pipes, fuel nozzles, oil sumps, and combinations thereof.

17. A method for reducing deposition of thermal decomposition products on a wall of an article containing a hydrocarbon fluid at temperatures above 105° C. comprising, depositing an anti-coking coating on a first surface of the wall of the article that is wetted by the hydrocarbon fuel, the anti-coking coating comprising a copper salt, a silver salt, or a combination thereof, the hydrocarbon fluid contacting and flowing across the anti-coking coating, wherein the copper salt comprises copper (II) sulfate, copper (II) nitrate, copper (II) chloride, copper (II) chloride anhydrous, copper (II) chloride dihydrate, or combinations thereof.

18. The method of claim 17, wherein deposition the anti-coking coating on the first surface of the wall of the article is performed in an isolated environment.

* * * * *